United States Patent [19]
Fukushima et al.

[11] Patent Number: 4,590,438
[45] Date of Patent: May 20, 1986

[54] BIPOLAR TRANSISTOR CIRCUIT WITH FET CONSTANT CURRENT SOURCE

[75] Inventors: Isao Fukushima; Yasunori Kobori; Hideo Nishijima, all of Katsuta, Japan

[73] Assignee: Hitachi, Ltd., Tokyo, Japan

[21] Appl. No.: 499,246

[22] Filed: May 31, 1983

[30] Foreign Application Priority Data

May 31, 1982 [JP] Japan .................................. 57-91225

[51] Int. Cl.$^4$ ............................................. H03F 3/16
[52] U.S. Cl. ..................................... 330/300; 330/253
[58] Field of Search ............... 330/253, 254, 261, 300, 330/310, 307

[56] References Cited
U.S. PATENT DOCUMENTS 4,460,874 7/1984 Haque .................. 330/261

OTHER PUBLICATIONS

Union Carbide Electronics ad from *Electronics*, Mar. 22, 1965, p. 62.

Primary Examiner—Eugene R. LaRoche
Assistant Examiner—Steven J. Mottola
Attorney, Agent, or Firm—Antonelli, Terry & Wands

[57] ABSTRACT

A transistor circuit is used as a signal amplifier which has little possibility of oscillation in an IC. The transistor circuit includes a cascade connection of differential amplifiers. Each of the amplifiers comprises a differential pair of bipolar transistors and an enhancement-type MOSFET as a constant current source. The MOSFET of each amplifier is connected in the common source mode, and the drain is connected to the emitters of the differential pair of bipolar transistors. The sources of all the MOSFETs are connected to a common ground-line.

8 Claims, 4 Drawing Figures

BIPOLAR TRANSISTOR CIRCUIT WITH FET CONSTANT CURRENT SOURCE

BACKGROUND OF THE INVENTION

This invention relates to a transistor circuit constructed by a combination of bipolar transistors and FETs (field effect transistors) which include IGFETs, MOSFETs, JFETs, etc.).

In an IC (integrated circuit) of the prior art, differential amplifiers shown in FIG. 1 are used widely. The arrangement of FIG. 1 includes a differential pair of transistors 1 and 2, a transistor 3 acting as a constant current source, a bias power source 7 for the differential pair of transistors 1 and 2, and a bias power source 8 as bias supply means for the transistor 3. The amount of the constant current of the transistor 3 is determined by a voltage of the bias power source 8 and a value of a resistance 6. The numerals 4 and 5 are resistances by which current variations of the differential pair of transistors 1 and 2, responding to the voltage variation of an input power source 14 connected between input terminals 9 and 10, are respectively supplied to output terminals 11 and 12 as a voltage variation. The numeral 13 designates a power supply terminal.

Referring to FIG. 1, if the output impedance of the constant current transistor 3 is very much larger than the active resistances of the transistors 1 and 2, the output impedances of (the transistors 1 and 2 at the emitter side) so that the constant current transistor 3 can be considered as an ideal constant current source supplying a constant current $I_0$, the currents $I_1$ and $I_2$ of the differential pair of transistors 1 and 2 are respectively shown as the following formulas:

$$I_1 = \frac{I_0}{1 + \exp\frac{-qV}{kT}} \simeq I_0 \left\{ 1 + \frac{qV}{kT} - \frac{1}{2!}\left(\frac{-qV}{kT}\right)^2 - \right. \tag{1}$$

$$\left. \frac{1}{3!}\left(\frac{-qV}{kT}\right)^3 - \frac{1}{4!}\left(\frac{-qV}{kT}\right)^4 + \ldots \right\}$$

$$I_2 = \frac{I_0}{1 + \exp\frac{qV}{kT}} \simeq I_0 \left\{ 1 - \frac{qV}{kT} - \frac{1}{2!}\left(+\frac{qV}{kT}\right)^2 - \right. \tag{2}$$

$$\left. \frac{1}{3!}\left(\frac{qV}{kT}\right)^3 - \frac{1}{4!} \cdot \left(\frac{qV}{kT}\right)^4 + \ldots \right\}$$

In these formulas, k is the Boltzmann constant, T is an absolute temperature, q is a charge of an electron and V is a voltage signal of the input power source 14. Accordingly, the current variation $\Delta I$ of the transistor 1 is approximately shown by the following formula:

$$\Delta I = I_1 - I_2 \simeq 2I_0 \left\{ \frac{qV}{kT} + \frac{1}{3!}\left(\frac{qV}{kT}\right)^3 + \right.$$

$$\left. \frac{1}{5!}\left(\frac{qV}{kT}\right)^5 + \ldots \right\}$$

As can be seen from the above formula, the current variation $\Delta I$ does not contain the even-number higher harmonics. As the result, the output signal of the differential amplifier has less distortion than a common-emitter transistor amplifier. As mentioned above, the differential amplifier has the capability of suppressing only the even-number higher harmonics so that a combination of the differential amplifiers is used widely as a signal amplifier circuit in ICs.

Although the above discussion holds true in theory, in actual practice the output impedance of the transistor 3 is finite. Because of this, the differential amplifier cannot cancel the even-number higher harmonics perfectly. Namely, in general, an effective base width of a transistor varies in response to the voltage between the collector and the emitter thereof, so that the collector current and the emitter current thereof vary, too. The output impedance of the transistor 3 is not much larger than the output impedance of the transistors 1 and 2 at the emitter side, that is, the active resistance $r_e$, so that a variable current of transistor 1 partially flows into the collector of the transistor 3, and all of the variable current does not flow into the transistor 3. For this reason, the differential amplifier shown in FIG. 1 does not sufficiently decrease the even-number higher harmonics, and the output signals at the output terminals 11 and 12 contain the evennumber higher harmonics.

Enlarging the base width of the transistor is effective for decreasing the variation of the collector current responding to the voltage variation between the collector and the emitter. In this case, however, a current amplification factor (abbreviated hfe) drops down so that the transistor may be unable to function satisfactorily as a current amplification device. In general, the differential amplifiers are used as a combination as shown in FIG. 2, and the decrease of the hfe of the transistors may have a very bad influence.

In FIG. 2, the same reference numerals are used to denote the same members as those shown in FIG. 1. Further, transistors 38 and 39 are emitter-follower transistors corresponding to the bias power sources 7 and 8 of FIG. 1, resistances 17, 18 and 19 determine bias voltages of the differential pair of transistors 1 and 2 and the transistor 3, diode-connected transistors 36 and 37 are used for the temperature compensation of the voltages between bases and emitters of the transistor 3, transistors 32, 33 and 26 acting as constant current sources, and the emitter-follower transistor 39. Resistances 20 and 21 are ones for respectively biasing the bases of the differential pair of transistors 1 and 2, and transistors 30 and 31 are emitter followers to which the constant currents are respectively supplied from the constant current transistors 32 and 33. A differential pair of transistors 34 and 35 constitutes a differential amplifier with the constant current transistors 26. The transistor 39 acts as a common bias source to the constant current transistors 3, 32, 33 and 26. The numeral 40 designates a capacitance for blocking a direct current, and the numeral 41 denotes an input signal source.

In the above-mentioned configuration, enlarging the base width to decrease the variations of the collector currents and the emitter currents responding to the voltage variations between the collectors and the emitters of the constant current transistors 3, 32, 33 and 26 results in the decrease of the hfe as further mentioned. Therefore, the variation of the base current, which is 1/hfe of the variation of the collector current and the emitter current, becomes large in proportion to the degree that the hfe becomes small. Further, as the input signal 41 from the source is amplified by the differential amplifier formed by the transistors 1, 2 and 3, the variations of the collector voltages of the constant current transistors 32, 33 and 26 become large so that the variations of the base currents thereof become large. These variations of the base currents cause a variation of the emitter current of the transistor 39. As a result, the variation is input to the transistor 3. Namely, the output signal is partially fed back to the input.

If the differential pair of transistors 1 and 2 has a complete balance of the direct current and the alternating current, voltage signals generated at the resistances 4 and 5 have the same polarity and the same amplitude, so that there is no influence on the base input signal of the transistor 3. In general, however, the differential pair of transistors 1 and 2 does not have a balance, and the differential voltage thereof is amplified by the differential amplifier constructed by the differential pair of transistors 34 and 35 and the constant current transistor 26, so that the possibility of an oscillation becomes high. The differential pair of transistors 1 and 2 does not have a balance in principle, since input impedances of the differential pair of transistors 1 and 2 are respectively an impedance of the input signal source 41 and the resistance 21. So, some feedback certainly occurs and the possibility of the oscillation becomes very high.

As mentioned above, decreasing the distortion causes the circuit to oscillate, so that designing the circuit requires special consideration. In particular, emitter resistances 6, 24, 25 and 27 are connected to the emitters of the constant current transistors 3, 32, 33 and 26 to decrease the gains of those transistors. The effect of the emitter resistances 6, 24, 25 and 27 is described hereinafter.

In the arrangement shown in FIG. 2, as the output signal of the output terminal 11' is supplied to an output terminal 65 via an emitter-follower stage having a low output impedance formed by a transistor 66 and a resistance 67, a signal current partially flows into a ground-line resistance 59, so that a signal voltage occurs at the resistance 59. In general, an IC has several ground-lines because of lay-out restrictions. Therefore, as shown in FIG. 2, a ground-line of the transistors 36, 37 and 38 is separate from other ground-lines. As a result, an unnecessary signal voltage occurs between the base and the emitter of the transistor 3. Therefore, it is necessary to insert the emitter resistance 6 into the emitter of the transistor 3 in order to decrease the gain and to prevent an oscillation. The emitter resistances 24, 25 and 27 have the same function. Namely, the arrangement of FIG. 3 needs extra resistances to avoid undesirable oscillation.

SUMMARY OF THE INVENTION

It is an object of the present invention to provide a transistor circuit as a differential amplifier having little possibility of oscillation by suppressing even-number higher harmonics.

It is a further object of the present invention to provide a transistor circuit including differential amplifiers which has little possibility of oscillation.

Briefly, the present invention provides a transistor circuit as a differential amplifier comprising a differential pair of bipolar transistors and a FET, which is connected in the common source mode, the drain of which is connected to the emitters of the bipolar transistors and which has a function of a constant current source to the differential pair of bipolar transistors.

Further, the present invention provides a stable transistor circuit having a cascade connection of differential amplifiers, each of which comprises differential pairs of bipolar transistors and a FET as a constant current source thereof, which is connected in the common source mode, and the drain of which is connected to the emitters of the bipolar transistors, wherein the sources of all the MOSFETs are connected to a common ground-line.

It is preferable to use an enhancement type MOSFET as the constant current source.

It is a well known technique to fabricate bipolar transistors and MOSFETs on a single IC chip. This invention uses features of the bipolar transistors and the MOSFETs. In this invention, a differential pair of bipolar transistors constituting a differential amplifier has a constant current source formed by a MOSFET which is connected in the common source mode. The gate of the MOSFET is biased by a bias power source, and the drain is connected to the emitters of the bipolar transistors. In general, an impedance of the MOSFET at the drain side is finite like a bipolar transistor, since an effective width of the gate thereof varies in response to a voltage variation between the drain and the source thereof. However, when both bipolar transistors and MOSFETs are fabricated in a single IC chip, since it is possible to make output impedances of the MOSFETs at the drain side very much larger than active resistances of the differential pair of bipolar transistors approximately independent of the characteristic of the bipolar transistors, it is very easy to make the MOSFETs almost ideal constant current sources.

As a result, therefore, it becomes possible to decrease sharply even-number higher harmonics of the currents of the differential pair of bipolar transistors and to obtain an output signal having no evennumber higher harmonics.

DETAILED DESCRIPTION OF THE INVENTION

Figure 1:
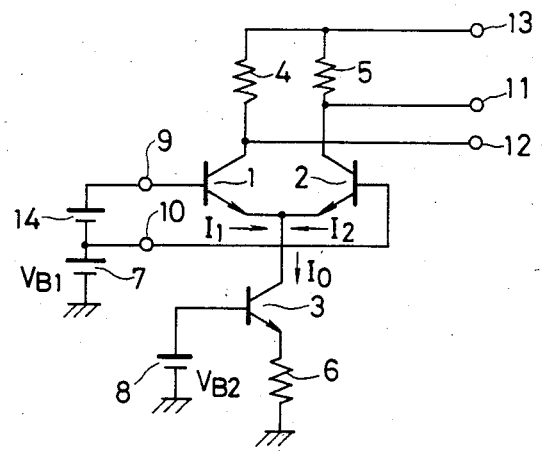
FIG. 1 shows a circuit diagram of a differential amplifier of the prior art.
Figure 2:
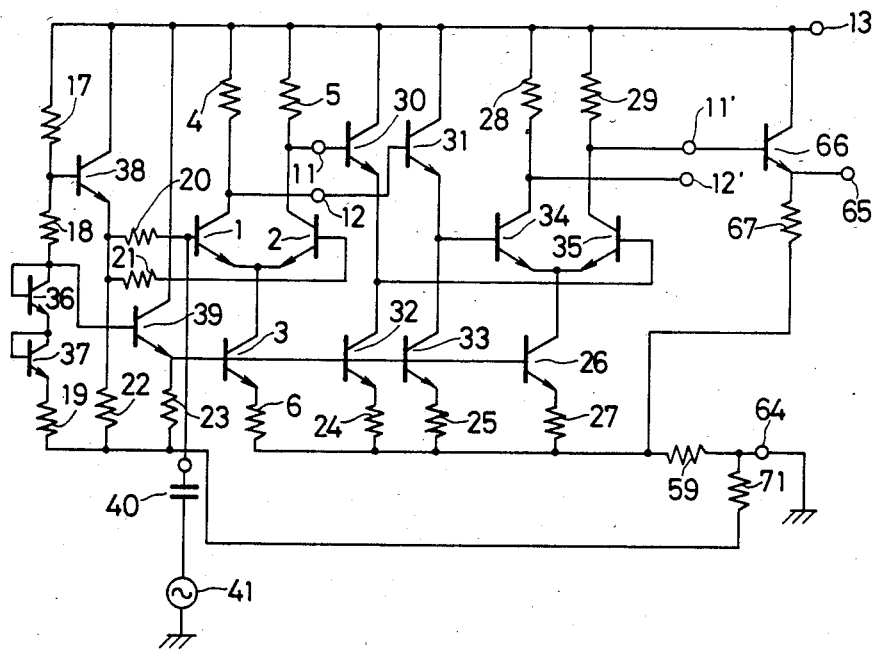
FIG. 2 shows a circuit diagram of a transistor circuit using the differential amplifier shown in FIG. 1.
Figure 3:
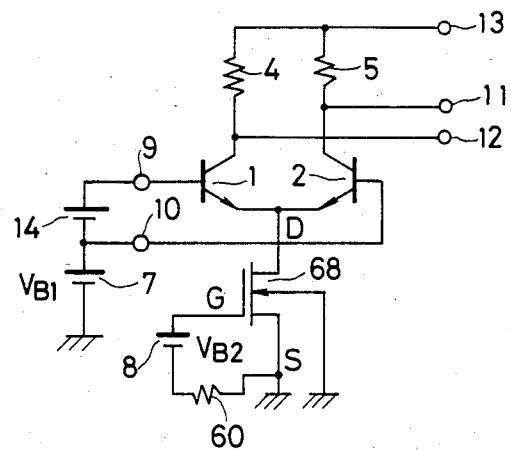
FIG. 3 shows a circuit diagram of a differential amplifier as an embodiment of the present invention.

FIG. 3 shows an embodiment of a differential amplifier of the present invention. In FIG. 3, the same reference numerals are used to denote the same members as those shown in FIG. 1. The differential pair of bipolar transistors 1 and 2 constitutes a differential amplifier with an enhancement-type MOSFET 68 as a constant current source thereof, the gate of which is biased by the bias power source 8 and the drain of which is connected to the emitters of the differential pair of bipolar transistors 1 and 2. The enhancement-type MOSFET 68 is connected in the common source mode, and the drain current thereof is unconditionally determined by the voltage of the bias power source 8 ($V_{B2}$). As mentioned in the Summary of the Invention, an enhancement-type MOSFET approximately works as an ideal constant current source. Therefore, it becomes possible to decrease sharply the even-number higher harmonics from the differential pair of the transistors 1 and 2 and to produce output signals having no evennumber higher harmonics at the output terminals 11 and 12.

Figure 4:
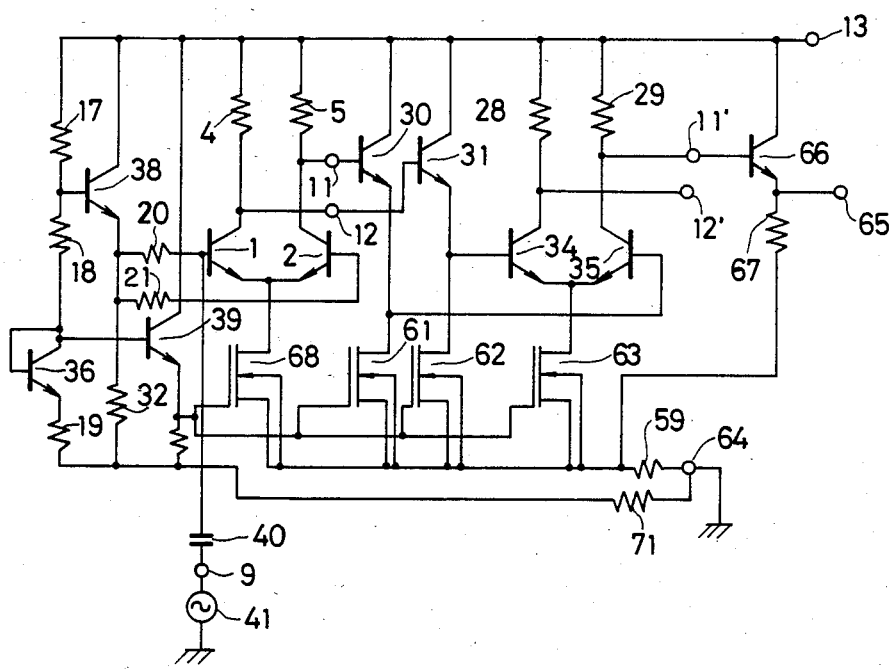
FIG. 4 shows a circuit diagram of an embodiment of the present invention, which is a transistor circuit using the differential amplifier shown in FIG. 3.

FIG. 4 shows an embodiment of a transistor circuit of the present invention. The transistor circuit has a first differential amplifier formed by the differential pair of transistors 1 and 2 having the MOSFET 68 as the constant current source, emitter-follower transistors 30 and 31 as buffers which are respectively connected to MOSFETs 61 and 62 as constant current sources, and the second differential amplifier formed by the differential pair of transistors 34 and 35 amplifying the output signals of the emitter-follower transistors 30 and 31 and having MOSFET 63 as a constant current source. The MOSFETs 61, 62 and 63 are enhancement-type and are connected in the common source mode like the MOSFET 68. The input signal is supplied to the terminal 9 from the input signal source 41, amplified by the cascade connected differential amplifiers and output to the output terminals 11' and 12'.

In this circuit configuration, it is possible to enlarge output impedances at the drain side of the MOSFETs as the constant current sources are independent of the characteristics of the bipolar transistors. This can be done, for example, by controlling a thickness of the gate oxide layers of the MOSFETs. Therefore, it becomes possible to make the output impedances very much larger than active resistances of the emitter-follower transistors and the differential pair of transistors and to make the MOSFETs almost ideal constant current sources. Therefore, even if the voltages of the MOSFETs 68, 61, 62 and 63 at the drain side vary, the constant currents do not vary. Thus, voltage variations do not occur at the gate side. Accordingly, where the gates of the MOSFETs 68, 61, 62 and 63 are connected to a common ground-line and biased by the emitter-follower transistor 39, the voltage variations of the MOSFETs 61, 62 and 63 at the drain side are not transmitted to the gate of the first stage MOSFET and oscillation does not occur.

Further, in the circuit shown in FIG. 4, it is possible to make mutual conductances of the MOSFETs smaller than these of the bipolar transistors, so that there is little possibility of an oscillation caused by a ground-line resistance, even if the MOSFETs do not have source resistances. Even if in the IC lay-out shown in FIG. 4 the ground-line resistances 59 and 71 are inserted, the unnecessary signal voltage occurring on the ground-line resistance 59 caused by the current variation of the output signal of the emitter-follower transistor 66, which is supplied to the MOSFET 68 between the gate and the source, has little possibility of causing oscillation.

In the above embodiment, the emitter-follower transistors 30 and 31 serve as buffers biased by the MOSFET 61 and 62. However, it is apparent that a transistor circuit which does not contain such buffers has essentially the same effect.

As described above, the present invention can provide a differential amplifier and a combination thereof which effectively suppresses even-number higher harmonics in an output signal and little possibility of oscillation.

It is to be understood that the above-described arrangements are simply illustrative of the application of the principles of this invention. Numerous other arrangements may be readily devised by those skilled in the art which embody the principles of the invention and fall within its spirit and scope.

I claim:

1. A transistor circuit comprising:
   (a) a cascade connection of differential pairs of bipolar transistors,
   (b) a first group of FETs, each of which has a drain, a source and a gate, said FETs each being connected to a common ground-line in a common source mode, and the drain of each of said FETs being connected to the emitter of a different pair of said differential pairs of bipolar transistors,
   (c) bias supply means connected to the gates of said first group of FETs,
   (d) emitter-follower bipolar transistors inserted between adjacent differential pairs of bipolar transistors to operate as buffers between said adjacent pairs, and
   (e) a second group of FETs, each of which has a drain, a source and a gate, the drains of which are respectively connected to emitters of said emitter-follower bipolar transistors, and the sources of which are connected to said common ground-line, wherein said bias supply means supplies biases to the gates of said second group of FETs.

2. A transistor circuit according to claim 1, wherein said first group of FETs and said second group of FETs are enhancement-type MOSFETs.

3. A transistor circuit comprising:
   (a) a cascade connection of differential pairs of bipolar transistors,
   (b) a first group of constant current sources formed of a first group of FETs, each of which FETs has a drain, a source and a gate, said FETs each being connected to a common ground-line in a common source mode, and the drain of each of said FETS being connected to a different pair of emitters of said differential pairs of bipolar transistors,
   (c) bias supply means connected to the gates of said first group of FETs
   (d) emitter-follower bipolar transistors inserted between adjacent differential pairs of bipolar transistors to operate as buffers between said adjacent pairs, and
   (e) a second group of constant current sources formed of a second group of FETs, each of which has a drain, a source and a gate, the drains of which are respectively connected to emitters of said emitter-follower bipolar transistors, and the sources of which are connected to said common ground-line, wherein said bias supply means supplies biases to the gates of said second group of FETs.

4. A transistor circuit according to claim 3, wherein said first group of FETs and said second group of FETs are enhancement-type MOSFETS.

5. A differential amplifier integrated circuit fabricated on a single chip comprising:
   (a) a cascade connection of differential pairs of bipolar transistors fabricated into a differential amplifier on said chip, said bipolar transistors each having a base, an emitter and a collector with an output taken across the respective collectors of the last pair of bipolar transistors, an input coupled across the respective bases of the first pair of bipolar transistors, said bipolar transistors having output impedances;

(b) a FET separately associated with each of said pairs of bipolar transistors, each FET being on said chip and having a drain, a source and a gate, each of said FETs being connected to a common ground-line and being configured in a common source mode, the drains being respectively coupled to the emitters of the associated pair of bipolar transistors; and (c) bias supply means on said chip coupled to the gate of each of said FETs to cause each FET to function as a constant current source for said associated pair of bipolar transistors, the output impedance of each of said FETs being substantially larger than the output impedance of the associated bipolar transistors whereby even number harmonics of an input signal applied to the bases of said first pair of bipolar transistors are suppressed in the output from the last pair of bipolar transistors.

6. A differential amplifier circuit in accordance with claim 5 wherein said FETs are enhancement-type MOSFETs.

7. A differential amplifier circuit in accordance with claim 5 further comprising:

(a) emitter-follower bipolar transistors on said chip inserted between adjacent differential pairs of said bipolar transistors which operate as buffers between said adjacent pairs of differential bipolar transistors; and (b) a group of FETs, each of which has a drain, a source and a gate, the drains of which are respectively connected to emitters of said emitter-follower bipolar transistors of said buffers, and the sources of which are connected to said common ground-line wherein said bias supply means supplies biases to the gates of said second group of FETs.

8. A transistor circuit according to claim 6 wherein said group of FETs are enhancement-type MOSFETs.

* * * * *